(12) United States Patent
Guering (10) Patent No.: US 8,810,999 B2
(45) Date of Patent: Aug. 19, 2014

(54) METHOD OF EQUIPMENTS INTEGRATION FOR A COMPLEX ELECTRICAL CENTRE AND MODULE OF IMPLEMENTATION

(75) Inventor: Bernard Guering, Montrabe (FR)

(73) Assignee: Airbus Operations (SAS), Toulouse Cedex (FR)

( * ) Notice: Subject to any disclaimer, the term of this patent is extended or adjusted under 35 U.S.C. 154(b) by 194 days.

(21) Appl. No.: 13/449,390

(22) Filed: Apr. 18, 2012

(65) Prior Publication Data
US 2012/0268866 A1 Oct. 25, 2012

(30) Foreign Application Priority Data

Apr. 21, 2011 (FR) ...................................... 11 53475

(51) Int. Cl.
*H02B 1/26* (2006.01)
*H05K 7/20* (2006.01)
*H05K 7/14* (2006.01)
*H02G 3/00* (2006.01)

(52) U.S. Cl.
CPC ............... *H02G 3/00* (2013.01); *H05K 7/1432* (2013.01)
USPC ...... 361/627; 361/677; 361/699; 165/104.33; 244/118.1

(58) Field of Classification Search
USPC ............. 361/627, 676–678, 699; 165/104.33; 244/118.1; 307/9.1
See application file for complete search history.

(56) References Cited

U.S. PATENT DOCUMENTS

| 2,938,686 | A | * | 5/1960 | Lohstreter et al. ......... 244/118.1 |
| 3,717,805 | A | * | 2/1973 | Gnaedinger et al. ............ 363/13 |
| 4,153,225 | A | * | 5/1979 | Paulsen ....................... 244/118.1 |
| 4,551,632 | A | * | 11/1985 | Jourdan et al. .................. 307/9.1 |
| 4,648,570 | A | * | 3/1987 | Abdelmaseh et al. ...... 244/118.1 |
| 6,664,656 | B2 | * | 12/2003 | Bernier ........................... 307/9.1 |
| 7,170,747 | B2 | * | 1/2007 | Muirhead et al. ............. 361/715 |
| 7,365,974 | B2 | * | 4/2008 | Hartung ........................ 361/695 |
| 7,763,200 | B2 | * | 7/2010 | Linares ......................... 264/275 |
| 7,767,905 | B2 | * | 8/2010 | Meyer ............................. 174/60 |
| 2007/0086158 | A1 | | 4/2007 | Hartung |
| 2009/0107693 | A1 | | 4/2009 | Meyer |
| 2011/0127379 | A1 | * | 6/2011 | Jager et al. ................. 244/118.1 |

FOREIGN PATENT DOCUMENTS

| EP | 0093654 | 11/1983 |
| FR | 2612358 | 9/1988 |
| FR | 2822130 | 9/2002 |
| WO | 0223688 | 3/2002 |

OTHER PUBLICATIONS

French Patent Office, Preliminary Search Report for FR 1153475, Dec. 6, 2011 (2 pgs.): French language Written Opinion (4 pgs.).

* cited by examiner

*Primary Examiner* — Robert J Hoffberg
(74) *Attorney, Agent, or Firm* — Wood, Herron & Evans, LLP (57) ABSTRACT

An integration method and module aims at simplifying the electrical connections between equipment and an electrical power center to be supplied electricity, while enabling a good accessibility of each piece of equipment for easier maintenance. To do so, a particular integration of this equipment is carried out so as to be able to connect the equipment in a direct extension of the electrical power center. According to one embodiment, an integration module includes a frame and a cover, the frame having a substantially parallelepipedic shape adapted to be able to extend longitudinally along a main axis in parallel with a longitudinal main side of the electrical power center. Cells, which define a constant cross section and an adjustable width enabled by movable intermediary walls, extend perpendicularly to the main longitudinal axis. Such cells are adapted to receive formatted electrical equipment.

16 Claims, 7 Drawing Sheets

METHOD OF EQUIPMENTS INTEGRATION FOR A COMPLEX ELECTRICAL CENTRE AND MODULE OF IMPLEMENTATION

TECHNICAL FIELD

The invention relates to a method for integrating equipment for a complex electrical power centre in a structure to be electrically supplied, in particular for a plane power centre. The invention also relates to an electrical power integrating module adapted for implementing the method. The invention applies particularly to commercial planes being in operation nowadays.

BACKGROUND

Thus, in a main application, but not exclusively, the invention relates to the electrical system on board planes. In such a system, an "electrical power centre" function is conventionally integrated into a technical cargo compartment of the plane so as to manage and distribute electrical power for all consumers. Such management is structured depending on the different operating modes being predefined according to the flight phases and conditions, in particular depending on pre-determined failure cases.

Owing to the present tendency to the "all-electrical" on board planes, such electrical system becomes the main system in terms of on-board distribution power for technical and also commercial reasons.

In such conditions, the component size in the electrical system increases substantially and the installation becomes more complex, in particular the implementing means for the electrical power centre function.

The integration of the "electrical power centre" function has thus turned out to be problematic due to the complexity thereof and to the new requirements dictated by safety (for instance, doubling the voltage) as well as to the environmental structures in a composite material based on carbon fibers. The cargo compartment area dedicated to the electrical power centre function is now saturated in terms of congestion, in particular with the number of interconnecting cables between electrical boxes. The maintenance of such area may become delicate.

In general, for practical reasons, the "electrical power centre" function is divided into two independent assemblies, except obviously for the power centre-to-power centre or inter-power centre interconnections arranged "on the left side" and "on the right side" in the dedicated area.

Each of such assemblies comprises a main box, being conventionally designated by "electrical power centre", and a set of satellite boxes also referred to as "power boxes". For practical reasons such as congestion, mass, high heat dissipation, problematic electrical connections, and electromagnetic disturbances, such power boxes are not integrated into the main box.

The complexity of the overall installation, resulting from the "all-electrical" evolution mentioned hereinabove, then results in an increasing number of satellite boxes connected to the main box depending on the structure thereof.

In general, each main box can be structured into several main areas: so-called "normal" areas and one emergency area, each area being itself divided into places with different voltages: alternating current and direct current areas. All those areas stay totally independent.

Relating to the satellite boxes, they are formed with equipment dedicated to the power supply of the areas of the main boxes, each satellite box being associated with a determined area. Such equipment using large section electrical connections consist in general in:
  autotransformer units (in short ATU) for transforming alternating voltages, each ATU unit having a high mass, typically 30 kg;
  transformer-rectifier units (in short TRU) for rectifying alternating current into direct current, each TRU unit having also a high mass, typically about 25 kg;
  static undulators for converting direct current into alternating current, with also a typical mass of about 15 to 20 kg; and
  batteries of about 50 kg per unit.

Such conventional architecture suffers from major disadvantages, in particular:
  the immobilization of a high volume in the cargo compartment;
  over-lengths of connecting cables involving mass loss and a problematic line drop for direct current;
  some complexity for wiring and overall integration of the cables;
  a reduced access to heavy equipment involving a difficult maintenance, requiring two operators for some equipment;
  a specific venting circuit being complex, bulky and expensive due to congestion;
  a decreased integrity and thus a reduced reliability for the electrical power centre function due to the fact that such function is burst out and the connecting cables are vulnerable; and
  a bad mechanical behaviour, in particular with respect to severe vibrations, of the equipment holding assemblies, such assemblies being sometimes able to be "aerial", i.e. on a cantilever frame being far from the fuselage; the problem results from the integration from the cubic shape (the equipment) to a wholly curved shape (the lower fuselage boat hull).

SUMMARY OF THE INVENTION

The invention aims at removing such disadvantages through simplifying the electrical connections of the equipment while allowing for a good accessibility of each piece of equipment and an easier maintenance. The invention also aims at allowing for a quick integration for an industrial implementation of the installation. To do so, a particular integration of such equipment is carried out with a direct relationship with the electrical power centre.

More precisely, an object of the present invention is to provide an integration method for equipment being dedicated to the power supply of an electrical power centre for a structure to be electrically supplied. Each piece of equipment is associated with one determined area of the electrical power centre. Such a method consists in formatting the equipment so as to be able to integrate them in alignment along the electrical power centre and to connect them in the direct extension of such power centre via an opposite electrical connection.

In particular, the electrical connection can integrate inter-power centre crossing connections when the structure comprises at least two electrical power centres.

Formatting the equipment is performed according to a parallelepipedic shape of a determined section and varying width.

In particular, splitting the equipment allows the equipment to homogenously distribute the equipment for transportation and optimized maintenance. In this case, the overall power of split equipment can be recovered through a series or parallel connection, for example at the level of the outlet connection of the module.

Advantageously, a fluidic cooling circulation, in particular through a forced circulation, is provided with an interface between relevant formatted equipment and an external circuit. A thermal insulation can be provided so as to insulate individually some pieces of equipment.

The invention also relates to an electrical power integration module being able to implement such a method. The module consists in a frame and a cover being hinged on the upper part of the frame in operation. The frame has a substantially parallelepipedic shape adapted to be able to extend longitudinally along a main axis in parallel with a longitudinal main side of an electrical power centre for the structure to be electrically supplied.

Such a module comprises cells of a constant section extending perpendicularly to the main axis and of a width to be adjusted along the main axis by intermediary movable dividing walls. The cells are adapted to receive electrical equipment being formatted in section according to the cell section. Each cell comprises stationary electrical connectors for an interface between the equipment connectors and the electrical power centre through direct connections formed by dedicated harnesses.

Such architecture allows electrical connections to be arranged at short distances and with a high reliability.

The module can also comprise a cooling circuit being active by fluid circulation with an interface with the formatted equipment, as well as at least a cell dividing wall provided with a thermal insulator for the equipment being inserted into such a cell.

The go-and-return side channels are connected to the ends of internal cooling circuits of the equipment through connectors arranged to be coupled while mounted on the equipment and the corresponding intermediary walls. Advantageously, the connectors for the cooling circuits of the equipment and the intermediary walls are quick connectors of the quick disconnect type.

BRIEF DESCRIPTION OF THE FIGURES

Other data, characteristics and advantages of the present invention will be evident upon reading the non limited description that follows, referring to the accompanying Figs., wherein, respectively.

DETAILED DESCRIPTION

The terms "upper" and derivatives, "lower" and derivatives, as well as "vertical" and derivatives, relate to a relative localization of elements or element parts positioned in operation or equivalent.

Figure 1:
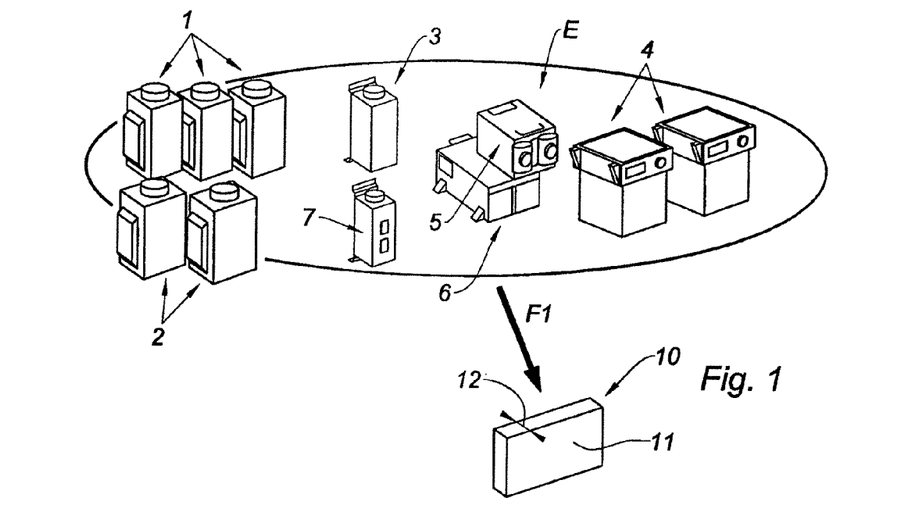
FIG. 1 is a view of an equipment set to be standardized according to a schematically illustrated model.

Referring to FIG. 1, the set E illustrates electrical equipment of an electrically autonomous structure, a plane in the example. This equipment has different sizes. There can be mentioned three autotransformers (AT) 1, two transformers-current rectifiers (TR) 2, a static undulator 3, two batteries 4 and other pieces of equipment 5, 6, 7 associated with the electrical power centre so as to be applied to the APU (auxiliary power unit). The "electrical power centre" function is divided into two independent boxes or power centres 9 (only the left power centre is represented on the Figs.).

Each of the pieces of equipment 1 to 7 is formatted (arrow F1) according to a model 10 in a wholly parallelepipedic shape with a main section 11 of a determined size. Such formatting is made possible by an internal rearrangement of the different elements of equipment with a width 12 of the model 10 being variable as a function of the congestion of the elements. Such adaptable width 12 provides the degree of freedom allowing for the formatting in the equipment.

Figure 2:
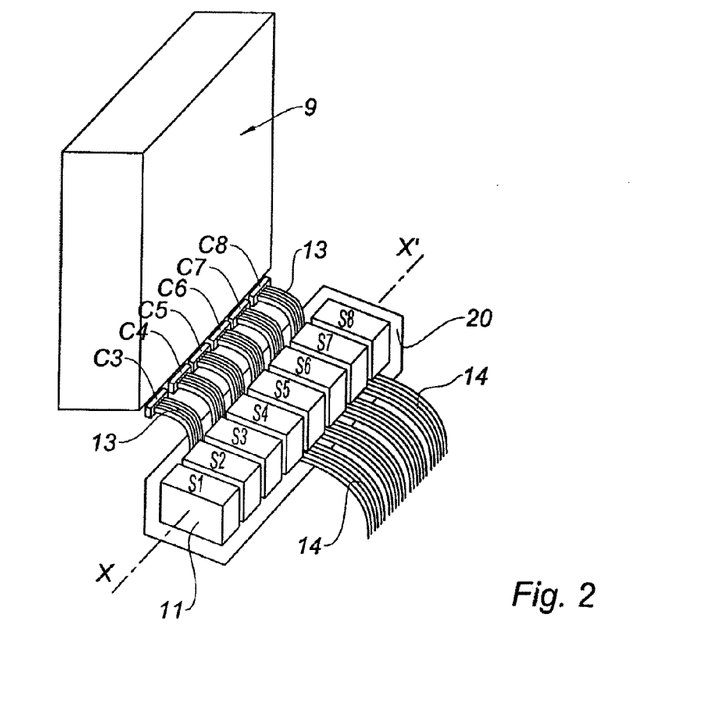
FIG. 2 is a schematic perspective view of an exemplary connection between an electrical power centre and a power module according to the invention.

On the perspective view of FIG. 2, the formatted pieces of equipment S1 to S8 are arranged in a power module 20 (represented in a cutaway view) opposite the electrical power centre 9. The pieces of equipment are assembled together in parallel with each other so that their main section 11 stays perpendicular to the longitudinal axis X'X of the module 20. The formatted pieces of equipment S1 to S8 are inserted according to such a rank that each piece of equipment is respectively opposite the connection C3 to C8 of the power centre 9 corresponding to the organ it controls or it supplies in electricity.

Thus, the pieces of equipment form an extension of the power centre 9 through a direct electrical connection. The module 20 individually receives each formatted piece of equipment S1 to S8 in relationship with such electrical connection being adapted in interface, as will be described below.

The connection is performed by harnesses 13 formed by conductor webs. Other harnesses 14 cross the module 20 so as to arrange inter-power centre connections between the power centres 9.

In the example, a splitting of the battery equipment 4 has been made so as to allow for a more homogenous distribution of the equipment in mass and congestion. Transportation and maintenance are thus optimized. In such a case, the overall power of the initial battery is recovered through a series or parallel arrangement at the level of the outlet connection on the module 20.

Figure 3:
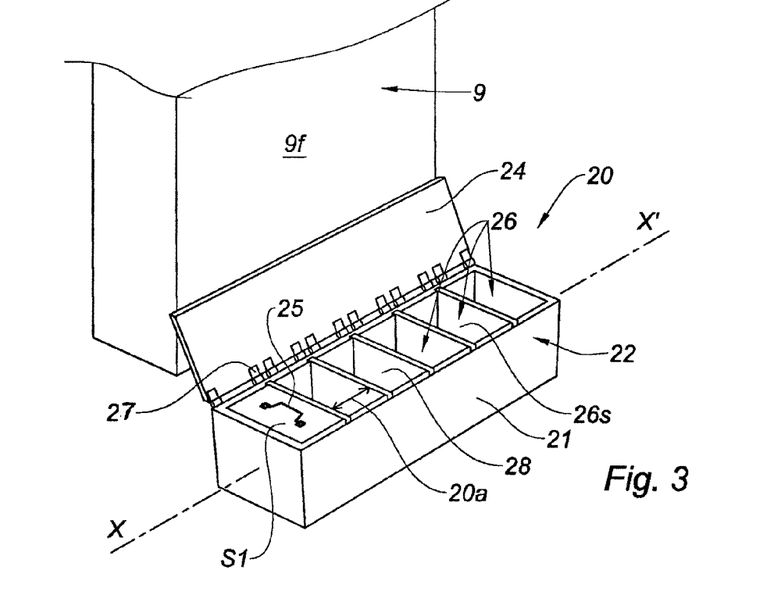
FIG. 3 is a perspective view more in detail of such module.

FIG. 3 shows the module 20 in a more detailed perspective view. The module 20 consists in a frame 22 and a cover 24 being hinged on the frame 22 and located in the upper part of the module in an operational mode. The frame 22 has a substantially parallelepipedic shape extending along a main longitudinal axis X'X and a main longitudinal section 21 (e.g. cross section) perpendicular to the sections 11 of the inserted equipment. Such a frame 22 extends directly opposite a main side 9f of the electrical power centre 9 of the plane.

The module 20 comprises cells 26 of a section 26s (e.g. cross section) being substantially equal to the section 11 of the formatted equipment and extending perpendicularly to the main axis X'X of the module 20. The width 20a of the cells 26 is adjustable as a function of the width of the equipment to be inserted by moving the movable intermediary dividing walls 28 sliding along said main axis X'X.

Each cell 26 receives electrical equipment being formatted in section, such as the equipment S1 shown on FIG. 3. The formatted equipment is advantageously provided with grips 25. The module 20 forms a closed volume in a locking position for the cover 24 with the help of a multipoint hinge 27.

Figure 4:
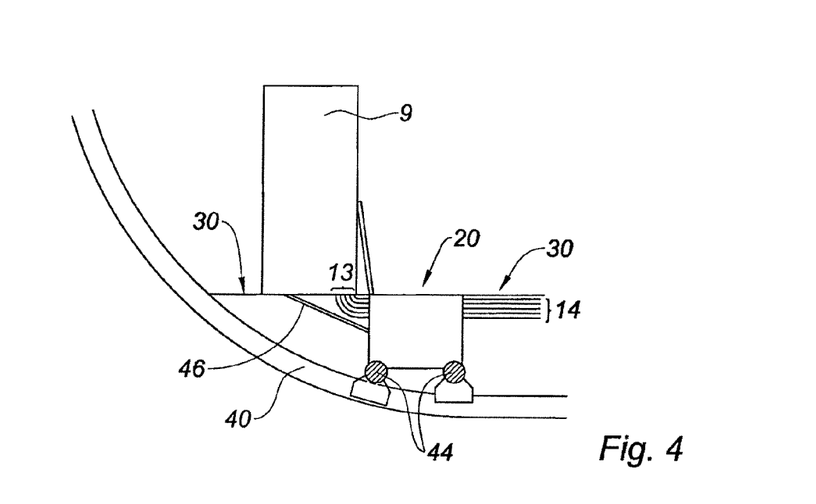
FIG. 4 is a side view of the previous module example in relationship with the primary frame of a front technical cargo compartment in a plane.

Referring to the side view of the power centre 9 located opposite the module 20 according to the FIG. 4, it appears that the module 20 is locally substituted for the cargo compartment floor 30. The frame 22 of the module 20 lies then as a primary sub-structure on top of the support framework 40 of the floor 30. Advantageously, the power module 20 is then adapted for receiving high mechanical stresses.

The frame 22 is rigidly fastened on the framework 40 by four fasteners 44. It is laterally blocked on the electrical power centre 9 by connecting rods 46. On this FIG. 4, there are also the electrical connection harnesses 13 of the module 20 towards the power centre 9 and the connection harnesses 14 towards the other associated power centre (not shown).

The frame and the intermediary dividing walls of the module 20 are preferably added so as to limit the mass and make easier thermal dissipation. In one example, this frame 22 and the dividing walls 28 are made according to a trellis structure, as illustrated by the perspective view of FIG. 5. So as to simplify the Fig., the elements are represented in the wire state. The trellis 23 consists in bars 23a along the edges thereof or in parallel with the latter, and in diagonal bars 23d crossing the sides defined between the edge bars 23a.

Figure 5:
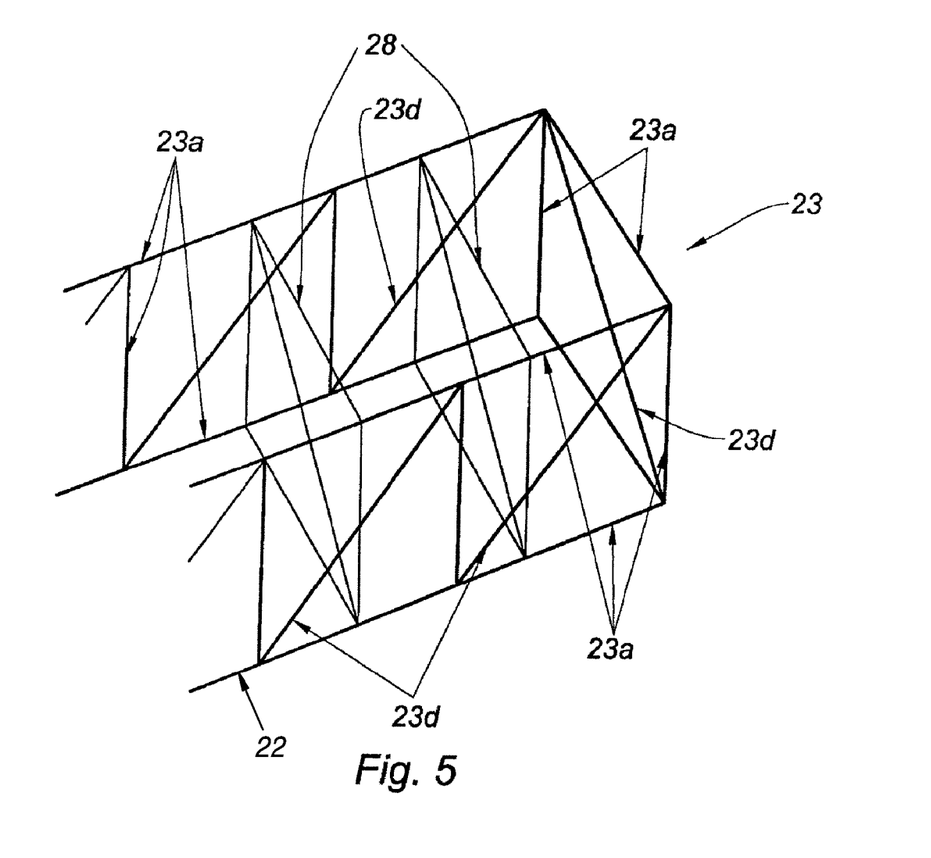
FIG. 5 is a part perspective of the previous module underlining the trellis structure thereof.
Figure 6:
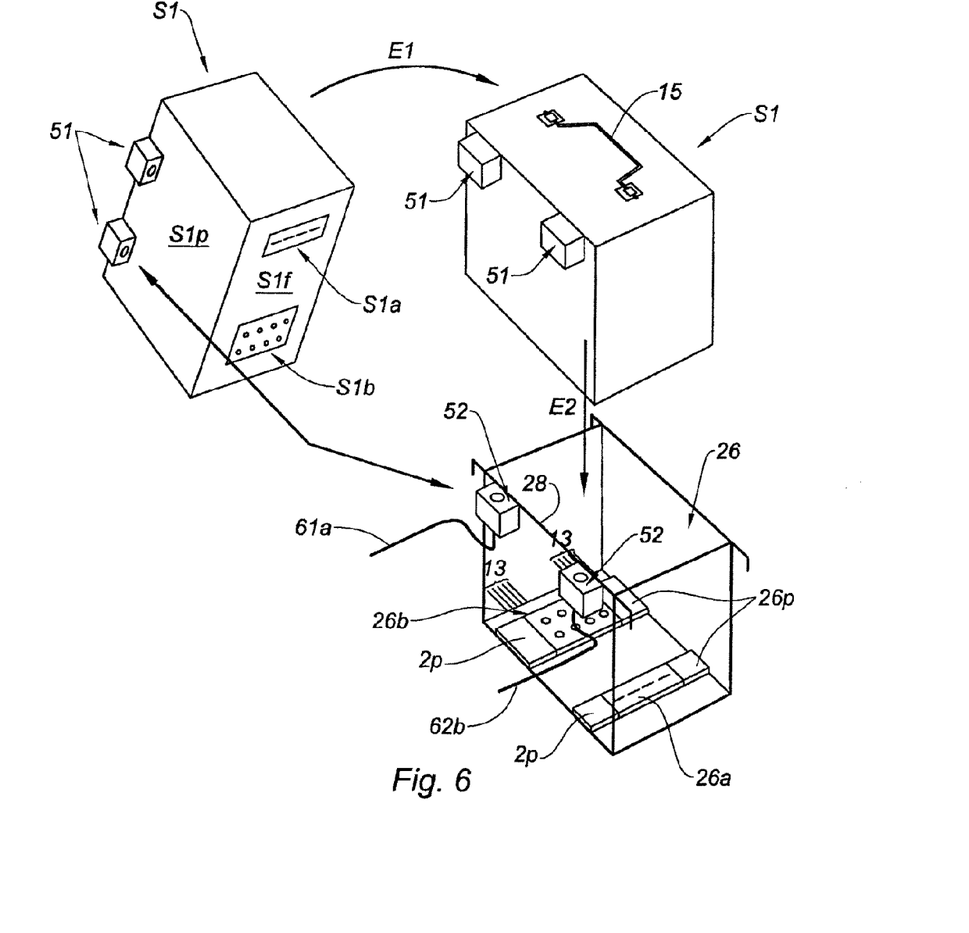
FIG. 6 is a view illustrating the positioning in two steps of a piece of equipment shown in a rotated upward view and aligned with the cell thereof shown in another view, and then inserted into the cell.
Figure 9:
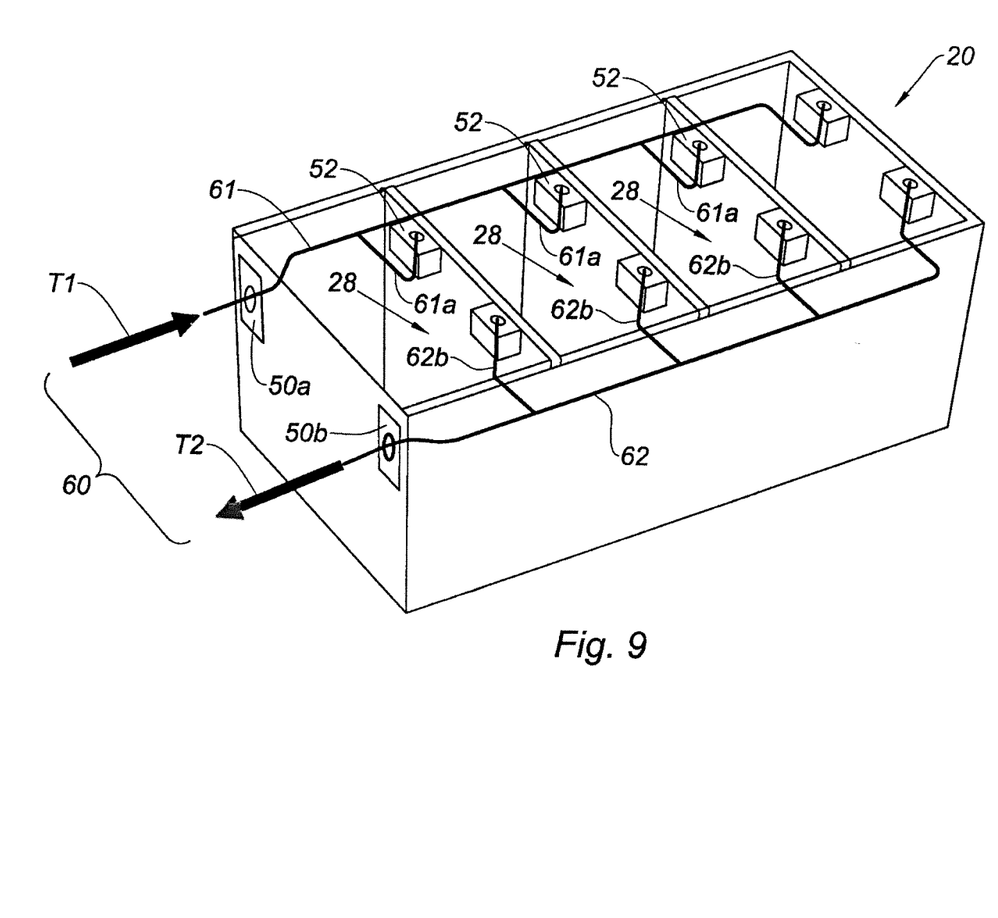
FIG. 9 is a perspective view of an example of cooling system through forced circulation in a power module according to the invention, with quick connection interfaces for equipment.

Such trellis structure enables to optimize the mass/stiffness ratio and to facilitate the power centre-to-power centre side electrical connections by the harnesses as well as the connections with the cooling circuit (see description with respect to FIG. 6 or 9). In particular, FIG. 6 shows that the piece of equipment S1 comprises two quick connectors S1 of the "quick disconnect" type of a cooling circuit on an upper edge of one main side S1p of the piece of equipment S1. These connectors 51 are coupled with an external circuit (not shown) for cooling the piece of equipment S1. The piece of equipment S1 also possesses electrical connectors on the lower bottom side S1f: one control connector S1a and one power connector S1b.

In a first step (arrow E1), the piece of equipment S1 is vertically positioned above the cell 26 using the grip 15 of the equipment. Then, in a second step (arrow E2), the piece of equipment S1 is inserted within the cell 26.

The cell 26 is shown in phantom so as to make control interface and power connectors 26a and 26b evident. Such connectors 26a and 26b, being arranged on lower platelets 2p forming a cell bottom 26p, are connected—at the end of the insertion of the piece of equipment S1 within the cell 26—to the corresponding connectors S1a and S1b of the piece of equipment S1. At the cell outlet, the control and power electrical conductors 1a and 1b, connected to the interface connectors 26a and 26b, are segregated and form the conductors of the harnesses 13.

The cell 26 also comprises, on the upper edge of the intermediary wall 28 thereof, quick disconnect connectors 52 coupled with side channels 61a and 62b for the go-and-return circulation of a cooling fluid. At the end of insertion of the piece of equipment S1, the connectors 51 of the equipment and the connectors 52 of the cell are connected so as to form cooling water circulation connections in the piece of equipment S1.

Figure 7A:
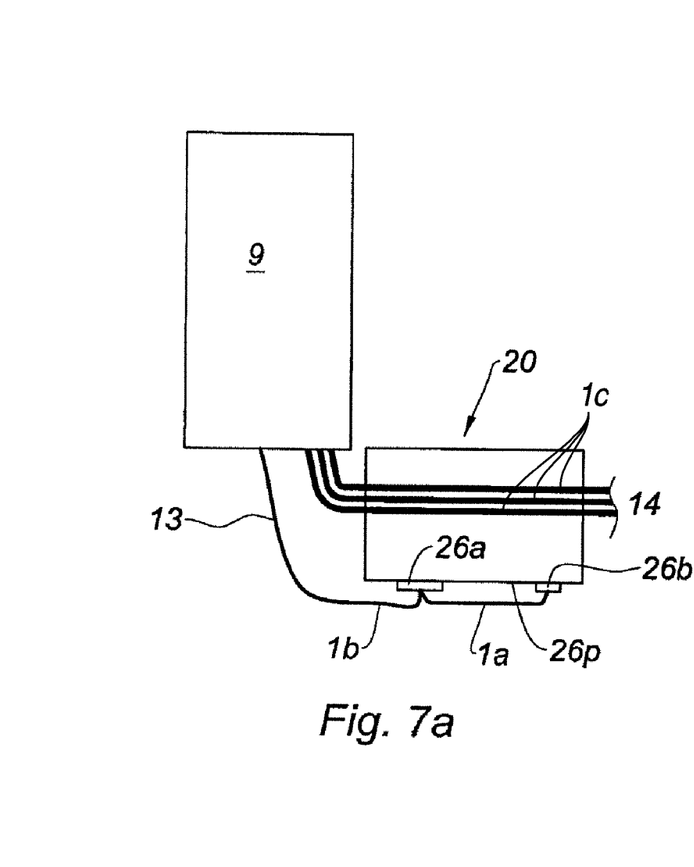
FIG. 7a is a schematic view showing the module-electrical power centre.
Figure 7B:
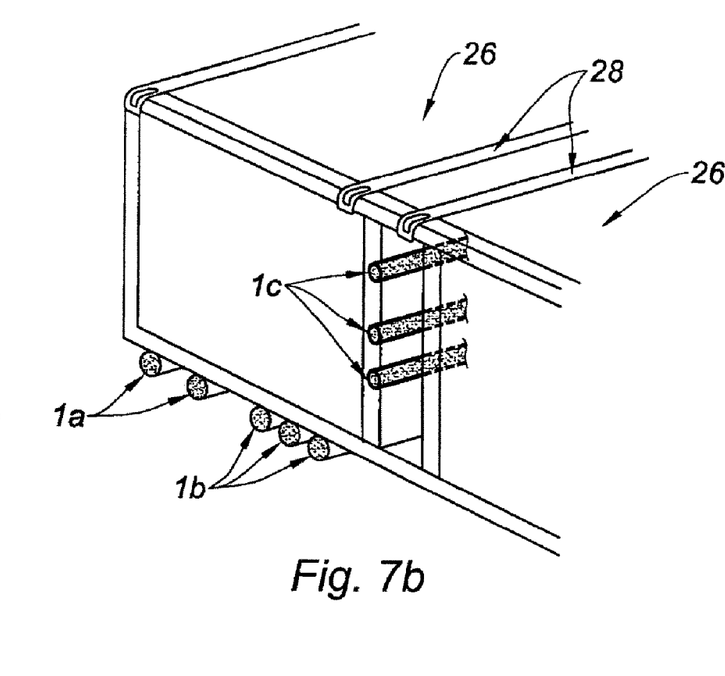
FIG. 7b is a schematic view showing the inter-power centre connections.

The schematic side and perspective views of the module 20 on FIGS. 7a and 7b more particularly illustrate the electrical connection harnesses 13 between the module 20 and the electrical power centre 9, as well as the inter-power centre connection harnesses 14. Such electrical connections consist in conductors 1a and 1b (module-power centre connection) as well as conductors 1c (power centre-power centre connection) forming, as detailed hereinabove, the harnesses 13, 14 of conductor webs.

The electrical power centre-power centre conductors cross the module 20 between two intermediary walls 28 of two adjacent cells 26 adapted for containing equipment.

The conductors 1a and 1b for connection between the connectors 26a and 26b of the bottom 26p of the cell 26 in the module 20 and the power centre 9 are segregated between the control and power conductors 1a and 1b, respectively.

Figure 8:
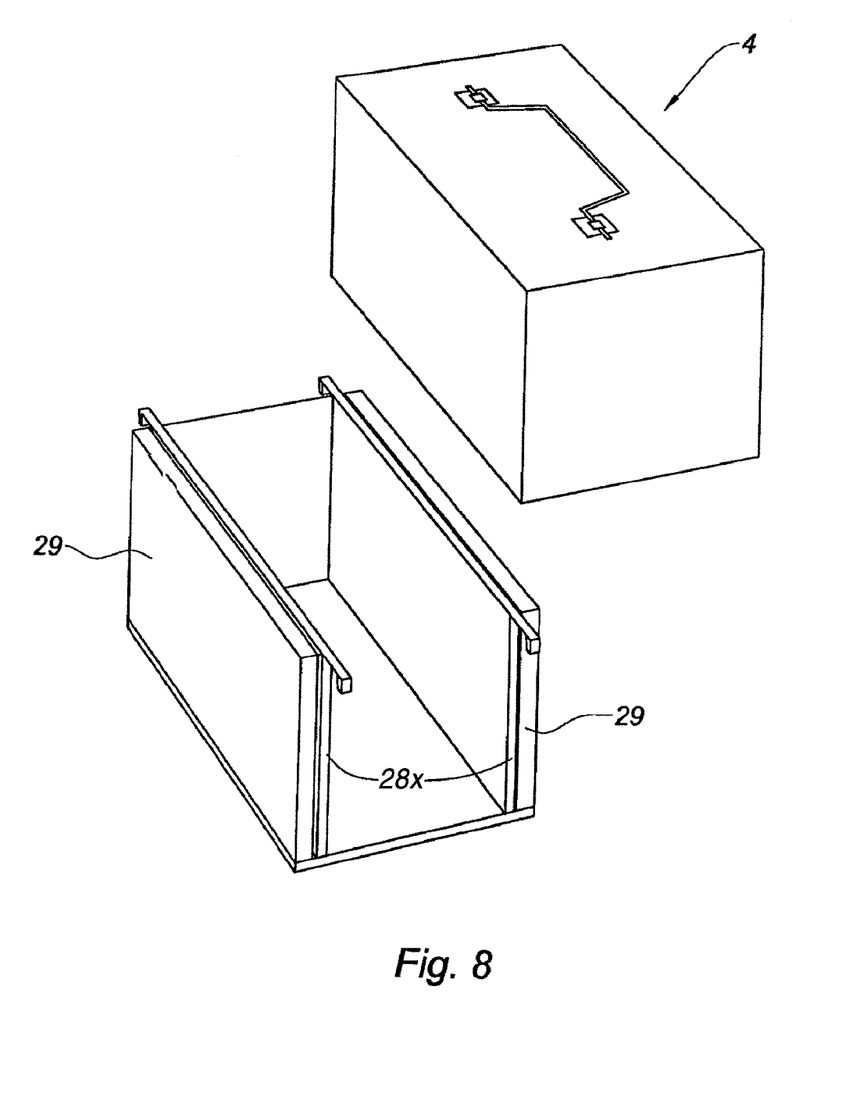
FIG. 8 is a perspective view of an exemplary cell provided with thermally insulated walls for battery-type equipment.

The cells 26 of the module 20 can also be provided with thermally insulated divider walls 28x, as illustrated in the perspective view of FIG. 8. In such example, both walls 28x of the cell 26 are equipped with a protecting layer 29 consisting in a thermally insulated material, for example, rock wool or cellulose wadding.

Such thermal insulation 29 is made for passively insulating the equipment surrounding the piece of equipment, for instance, a battery 4, being inserted with the insulated cell. The batteries 4 being usually used are formatted through splitting into batteries 4 of about 25 kg, for maintenance and transportation reasons.

A particular advantage of the invention is to make the active cooling of the equipment easier with a fluid circulation. FIG. 9 illustrates, in a perspective view, an example of a cooling system 60 using forced circulation of a heat bearing fluid in a power module 20.

The fluid is fed by an external manifold (arrow T1) mounted on a quick connection interface 50a of the frame 22. Then, the fluid circulates in a go pipe 61 connected to the intermediary walls 28 by go side channels 61a. Such go side channels 61a are coupled to the quick disconnect connectors 52 so as to be connected to the internal cooling circuits of the equipment S1 (see FIG. 6).

After a thermal exchange in the equipment, the heated fluid is fed in the return side channels 62b coupled to a return pipe 62. Such return pipe 62 is connected to an external outlet manifold (arrow T2) via a quick connection interface 50b.

The invention is not limited to the exemplary embodiments being described and illustrated. So, the equipment can be equipped with positioning mini-feet under the lower side thereof so as to avoid the degradation of the electrical connectors when the equipment is put on the ground, outside the module.

Furthermore, the organization of the power centre-equipment relationship according to the invention enables to recover volume with the area located behind the electrical power centres. Such volume gain enables to reposition the power centres closer to the plane fuselage, releasing space within the central area of the cargo compartment. Such a release simplifies the routing for the electrical harnesses of the fuselage floor, in particular the current return harnesses. Moreover, a mechanical reinforcement on the module can be performed with adjustable supports with respect to reinforced areas of each formatted piece of equipment. Filtering residual vibrations can then be carried out if necessary.

The invention does not only apply to electrical supply of plane power centres, but also to other structures being at least partially supplied in electricity, for instance: boats, cars, locomotives, etc.

The invention claimed is:

1. An integration method for a plurality of pieces of equipment being dedicated to a power supply of an electrical power centre for a structure to be electrically supplied, each piece of equipment in the plurality of equipment being associated with one predetermined area of the electrical power centre, the method comprising:

formatting the plurality of equipment so as to be able to integrate the plurality of equipment in alignment along the electrical power centre; and inserting the plurality of equipment into cells defined in a module that is separate from the electrical power centre and serves as an extension of the electrical power centre, and connecting the plurality of equipment in linear alignment within the module such that the plurality of equipment and the electrical power centre are automatically coupled electrically upon insertion via an electrical connection extending therebetween, the electrical connection defined at least in part by connectors on the plurality of equipment interfacing with stationary electric connectors in the cells of the module when the plurality of equipment are completely inserted into the cells of the module.

2. The integration method according to claim 1, further comprising:

integrating inter-power centre crossing connections within the module when the structure to be electrically supplied comprises at least two electrical power centres, one of the at least two electrical power centres is the electrical power centre, each of the at least two electrical power centres is separate from the module.

3. The integration method according to claim 1, wherein formatting the plurality of equipment further includes shaping each of the plurality of equipment so as to define a parallelepipedic shape of a determined section and a varying width.

4. The integration method according to claim 1, further comprising:

splitting at least one of the pieces of equipment so as to allow the split piece of equipment to be homogenously distributed for transportation and optimized maintenance, wherein an overall power of the split piece of equipment is recovered through a series or parallel connection provided at an outlet connection of the module.

5. The integration method according to claim 1, further comprising:

segregating electrical control and power connections at the module.

6. The integration method according to claim 1, further comprising:

providing a forced fluidic cooling circulation with an interface located in the module for communication between the plurality of equipment and an external circuit.

7. The integration method according to claim 1, further comprising:

providing a thermal insulation at the module so as to insulate individually the plurality of equipment.

8. An electrical power integration module for use with an electrical power centre for a structure to be electrically supplied, the electrical power centre being separate from the module such that the module serves as an extension of the electric power centre, and the module comprising:

a frame having a substantially parallelepipedic shape adapted to be able to extend longitudinally along a main axis in parallel with a longitudinal main side of the electrical power centre;

a cover hinged in connection to an upper part of the frame in operation; and intermediary movable dividing walls located in the frame, wherein the frame and the cover collectively define a plurality of aligned cells of a constant cross section extending perpendicularly to the main axis and of a width to be adjusted along said main axis by the intermediary movable dividing walls, and wherein each of the cells receives one of a plurality of pieces of equipment being that are formatted in cross section to match the constant cross section of the cells, each of the cells further comprising stationary electrical connectors coupled to dedicated harnesses to provide an electrical interface between connectors on the plurality of equipment and the electrical power centre.

9. The integration module according to claim 8, wherein the stationary electrical connectors of the cells are fastened on a bottom part of the cells and are automatically connected to the connectors of the plurality of equipment immediately upon complete insertion of the plurality of equipment into the cells.

10. The integration module according to claim 8, further comprising:

a module cooling circuit generating forced cooling fluid circulation; and a cooling interface configured to communicate cooling fluid between the module cooling circuit and the plurality of equipment to thereby provide cooling to the plurality of equipment.

11. The integration module according to claim 10, wherein the module cooling circuit further includes performs a go pipe, connected to the intermediary movable dividing walls by go side channels, and a return pipe coupled to return side channels connected to the intermediary movable dividing walls, wherein ends of internal cooling circuits provided within the plurality of equipment are arranged to become fluidicly coupled with the intermediary movable dividing walls and the go side channels and the return side channels during mounting of the plurality of equipment into the aligned cells defined by the intermediary movable dividing walls.

12. The integration module according to claim 8, wherein the intermediary movable dividing walls further comprise:

a thermal insulator for the pieces of equipment being inserted into adjacent cells of the plurality of aligned cells.

13. The integration module according to claim 8, wherein the frame and the intermediary dividing walls are perforated according to a trellis structure.

14. The integration module according to claim 8, wherein the frame and the cover collectively define a closed volume in a closed, locking position of the cover.

15. The integration module according to claim 8, wherein the cover is adapted to be able to be locally substituted for a cargo compartment floor resting in a primary sub-structure on a floor support framework when in a closed, locking position, such that the frame and intermediary dividing walls are located below the cargo compartment floor.

16. The integration module according to claim 8, wherein the frame is rigidly fastened in at least four points on a primary sub-structure on a floor support framework by fasteners and is laterally blocked by connecting rods extending from the electrical power centre.

* * * * *